United States Patent
Adusumilli et al.

(10) Patent No.: US 10,269,710 B2
(45) Date of Patent: Apr. 23, 2019

(54) MULTI-LEVEL METALLIZATION INTERCONNECT STRUCTURE

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 15/918,870

(22) Filed: Mar. 12, 2018

(65) Prior Publication Data
US 2018/0204800 A1    Jul. 19, 2018

Related U.S. Application Data

(62) Division of application No. 15/240,700, filed on Aug. 18, 2016, now Pat. No. 9,935,051.

(51) Int. Cl.
*H01L 23/528* (2006.01)
*H01L 27/088* (2006.01)
(Continued)

(52) U.S. Cl.
CPC .... *H01L 23/5283* (2013.01); *H01L 21/76804* (2013.01); *H01L 21/76843* (2013.01);
(Continued)

(58) Field of Classification Search
CPC ....... H01L 2924/00014; H01L 2924/00; H01L 2224/48091; H01L 2924/0002;
(Continued)

(56) References Cited

U.S. PATENT DOCUMENTS 4,829,013 A * 5/1989 Yamazaki ......... H01L 31/03921
                                                                                         136/256
5,394,012 A * 2/1995 Kimura ............. H01L 21/28512
                                                                                         257/739
(Continued)

OTHER PUBLICATIONS

Yang, et al., "Enhanced via Integration Process for Copper/Ultralow-k Interconnects", IEEE Electron Device Letters, Apr. 2010, pp. 347-349, vol. 31, No. 4.
(Continued)

*Primary Examiner* — Jaehwan Oh
(74) *Attorney, Agent, or Firm* — Scully, Scott, Murphy & Presser, P.C.; Daniel P. Morris, Esq.

(57) ABSTRACT

A semiconductor structure is provided that includes a contact structure containing a gouged upper surface embedded in at least a middle-of-the-line (MOL) dielectric material, wherein the contact structure contacts an underlying doped semiconductor material structure. A first metallization structure containing a gouged upper surface is in contact with the gouged upper surface of the contact structure and embedded in a first interconnect dielectric material. A second metallization structure is in contact with the gouged upper surface of the first metallization structure and embedded at least within a second interconnect dielectric material.

19 Claims, 7 Drawing Sheets

(51) Int. Cl.
 *H01L 23/532* (2006.01)
 *H01L 21/768* (2006.01)
(52) U.S. Cl.
 CPC .. *H01L 21/76877* (2013.01); *H01L 23/53266* (2013.01); *H01L 27/0886* (2013.01)
(58) Field of Classification Search
 CPC ........... H01L 33/22; H01L 2224/48247; H01L 2933/0016; H01L 33/32; H01L 33/382; H01L 33/62
 See application file for complete search history.

(56) References Cited

U.S. PATENT DOCUMENTS

| | | | |
|---|---|---|---|
| 6,157,081 A | 12/2000 | Nariman et al. | |
| 6,624,066 B2 | 9/2003 | Lu et al. | |
| RE38,383 E * | 1/2004 | Choi | H01L 21/76814 257/763 |
| 7,517,736 B2 | 4/2009 | Mehta et al. | |
| 7,528,066 B2 | 5/2009 | Yang et al. | |
| 7,800,228 B2 | 9/2010 | Yang et al. | |
| 7,964,966 B2 | 6/2011 | Yang et al. | |
| 9,595,518 B1 * | 3/2017 | Chou | H01L 27/0629 |
| 9,634,084 B1 * | 4/2017 | Sheraw | H01L 21/324 |
| 2004/0201038 A1 * | 10/2004 | Kimura | H01L 29/66462 257/192 |
| 2007/0029541 A1 * | 2/2007 | Xin | H01L 33/04 257/14 |
| 2008/0067497 A1 * | 3/2008 | Kim | H01L 33/02 257/13 |
| 2008/0108216 A1 * | 5/2008 | Lee | H01L 21/02063 438/597 |
| 2009/0079077 A1 | 3/2009 | Yang et al. | |
| 2009/0098728 A1 | 4/2009 | Grunow et al. | |
| 2009/0168305 A1 * | 7/2009 | Fleig | H01G 9/016 361/528 |
| 2010/0219437 A1 * | 9/2010 | Usuda | H01L 33/22 257/98 |
| 2012/0007118 A1 * | 1/2012 | Choi | H01L 33/382 257/98 |

OTHER PUBLICATIONS

Anonymous, "Sacrificial Liner for Contact Gouge Feature in Cu Integration", Apr. 15, 2010, ip.com, 6 pages.
List of IBM Patents or Patent Applications Treated As Related dated Mar. 12, 2018, 2 pages.

* cited by examiner

MULTI-LEVEL METALLIZATION INTERCONNECT STRUCTURE

BACKGROUND

The present application relates to a semiconductor structure and a method of forming the same. More particularly, the present application relates to a semiconductor structure including a multi-level interconnect structure that provides increased mechanical strength, improved anchoring and/or lower contact resistance and a method of forming such a semiconductor structure.

Multiple interconnect levels have been designed at the 7 nm node to provide wiring flexibility for system-on-chip (SOC) applications. Aggressive dimensional scaling for the 7 nm node has resulted in a significant increase in interconnect resistance. While tungsten has been used for many generations as a contact metal, it is no longer competitive because of the difficulty in scaling the thick high resistivity liner/barrier films and defectivity concerns.

Due to its ability to reflow, cobalt (Co) is attractive for void free gap fill and Co also enables scaling of the liner/barrier films. However, the reliability of Co interconnects and other low resistivity metals and metal alloy containing interconnects is a still a concern.

Similar to copper (Cu) metallization in back-end-of-the-line (BEOL) interconnects, poor mechanical strength may present challenges in terms of stress migration and electromigration for Co and other low resistivity metal or metal alloy containing interconnect structures. Therefore, there exists a need to provide reliable interconnect structures that have increased mechanical strength, improved anchoring and/or lower contact resistance.

SUMMARY

A semiconductor structure including a multi-level interconnect structure that provides increased mechanical strength, improved anchoring and/or lower contact resistance as well as a method of forming such a semiconductor structure are disclosed.

In one aspect of the present application, a semiconductor structure is provided. In one embodiment of the present application, the semiconductor structure includes a contact structure containing a gouged upper surface and embedded in at least a middle-of-the-line (MOL) dielectric material, wherein the contact structure contacts an underlying doped semiconductor material structure. A first metallization structure containing a gouged upper surface is in contact with the gouged upper surface of the contact structure and is embedded in a first interconnect dielectric material. A second metallization structure is in contact with the gouged upper surface of the first metallization structure and is embedded at least within a second interconnect dielectric material.

In another aspect of the present application, a method of forming a semiconductor structure is provided. In one embodiment of the present application, the method includes providing a contact structure containing a gouged upper surface embedded in at least a middle-of-the-line (MOL) dielectric material and contacting a doped semiconductor material structure, wherein a first interconnect dielectric material containing a contact opening is present above the contact structure and the MOL dielectric material, wherein the contact opening exposes the gouged upper surface of the contact structure. A first metallization structure is then formed in the contact opening within the first interconnect dielectric material. At least a second interconnect dielectric material containing a contact opening is formed above the first interconnect dielectric material, wherein the contact opening exposes the first metallization structure. Next, a gouging feature is formed in an upper surface of the first metallization structure, and thereafter a second metallization structure is formed in the contact opening within the second interconnect dielectric material.

DETAILED DESCRIPTION

Figure 1:
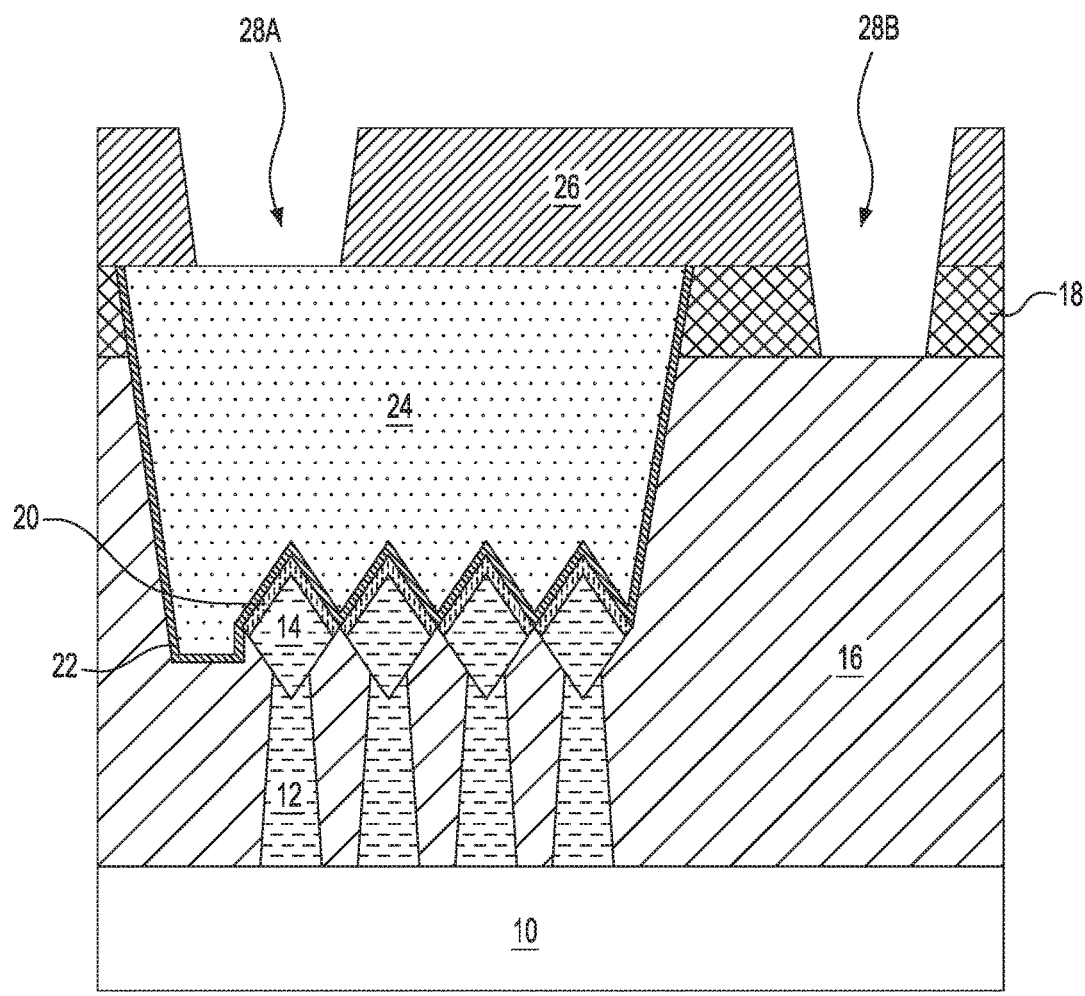
FIG. 1 is a cross sectional view of an exemplary semiconductor structure within one of a source region or a drain region, and including a contact structure embedded in at least a middle-of-the-line (MOL) dielectric material and contacting a doped semiconductor material structure, wherein a first interconnect dielectric material containing contact openings is present above the contact structure and the MOL dielectric material in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary semiconductor structure that can be employed in accordance with one embodiment of the present application. In FIG. 1, and the remaining drawing figures, the cross sectional view is through one of the source region or the drain region. It is noted that the source region and the drain region would have identical structures located therein, and as such, there is no need to include separate views illustrating both regions. As is known in the art, the source region and drain region are located on opposite sides of a gate region. So as not to obscure the present application, the gate region is not shown in any of the drawing figures of the present application, however, one skilled in the art would readily understand that the gate region is present over a channel region and that the channel region is located between the source region and the drain region.

With respect to FIG. 1, the exemplary semiconductor structure includes a contact structure (20, 22, 24) embedded in at least a middle-of-the-line (MOL) dielectric material 16 and contacting a doped semiconductor material structure 14, wherein a first interconnect dielectric material 26 containing contact openings 28A, 28B is present above the contact structure (20, 22, 24) and the MOL dielectric material 16 in accordance with an embodiment of the present application. In the present application, contact opening 28A is a contact opening formed in one of the source region or the drain region, while contact opening 28B is formed in the gate region (not shown).

The exemplary semiconductor structure of FIG. 1 further includes a substrate 10, semiconductor fins 12 extending upward from substrate 10, and a first dielectric capping layer 18 located on a surface of the MOL dielectric material 16. Although the present application describes and illustrates the presence of semiconductor fins 12, the semiconductor fins may be replaced with semiconductor nanowires or any other semiconductor material portion. The first dielectric capping layer 18 is optional and in some embodiments may be omitted. In embodiments in which the first dielectric capping layer 18 is omitted, the contact structure (20, 22, 24) has a topmost surface that is coplanar with a topmost surface of the MOL dielectric material 16. In the embodiment illustrated in FIG. 1, the contact structure (20, 22, 24) has a topmost surface that is coplanar with a topmost surface of the first dielectric capping layer 18.

The exemplary semiconductor structure that is shown in FIG. 1 may be formed utilizing any gate-first process or gate-last process that is well known in the art. In some embodiments and in either the gate-first process or the gate-last process, semiconductor fins 12 may be formed by processing an upper semiconductor material portion of a bulk semiconductor substrate (to be described in more detail herein below) or a topmost semiconductor material layer of a semiconductor-on-insulator (SOI) substrate. The semiconductor fins 12 can be formed utilizing a patterning process such as, for example, lithography and etching, or a sidewall image transfer (SIT) process. The term "semiconductor fin" denotes a contiguous semiconductor structure that extends upward from a surface of a substrate (such as substrate 10) and has a pair of vertical sidewalls that are parallel to each other. Each semiconductor fin includes a semiconductor material as defined below. As used herein, a surface is "vertical" if there exists a vertical plane from which the surface does not deviate by more than three times the root mean square roughness of the surface. The height and width of the semiconductor fins 12 can vary.

In some embodiments of the present application, the substrate 10 may be a semiconductor material portion of a bulk semiconductor substrate. The term "semiconductor material" denotes any material that has semiconducting properties. Illustrative examples of semiconductor materials that can be used in the present application include, for example, silicon (Si), germanium (Ge), silicon germanium alloys (SiGe), III-V compound semiconductors and/or II-VI compound semiconductors. III-V compound semiconductors include at least one element from Group III (i.e., Group 13) of the Periodic Table of Elements and at least one element from Group V (i.e., Group 15) of the Periodic Table of Elements, while II-VI compound semiconductors include at least one element from Group II (i.e., Group 2) of the Periodic Table of Elements and at least one element from Group VI (i.e., Group 16) of the Periodic Table of Elements). In one example, the substrate 10 may be composed of single crystal silicon.

In other embodiments of the present application, the substrate 10 may be composed of an insulator material which may be part of a SOI substrate. The insulator material that may provide the substrate 10 may be composed of crystalline or non-crystalline oxide or nitride. In one example, the insulator material that may provide the substrate 10 may be composed of silicon dioxide. In embodiments in which the insulator material is part of an SOI substrate, a handle substrate (not shown) may be located beneath the insulator layer. When present, the handle substrate may be composed of a semiconductor material (as defined above), an insulator material and/or a conductive material. When an SOI is employed, the SOI substrate can be formed utilizing any conventional technique including, for example, wafer bonding or SIMOX (Separation by Ion Implantation of Oxygen).

At least one gate structure (not shown) can be formed over a portion of the substrate 10. When semiconductor fins 12 are formed, the at least one gate structure straddles over a portion of each of the semiconductor fins 12. The at least one gate structure may be a functional gate structure or a sacrificial gate structure which is subsequently replaced with a functional gate structure after forming the source regions and the drain regions. The term "functional gate structure" is used throughout the present application as a permanent gate structure used to control output current (i.e., flow of carriers in the channel) of a semiconducting device through electrical or magnetic fields. The functional gate structure typically includes a gate stack of a gate dielectric material and a gate conductor. The term "sacrificial gate structure" denotes a material or material stack that serves as a placeholder for a functional gate structure.

The doped semiconductor material structure 14 can then be formed from exposed semiconductor surfaces such as, for example, semiconductor fins 12, that are not protected by a gate structure and are within the source region and the drain region of the structure. The doped semiconductor material structure 14 may, in some embodiments, be composed of a plurality of doped subunits. In other embodiments, the doped semiconductor materials structure 14 can be composed of a single doped subunit. The doped semiconductor material structure 14 may be formed utilizing an epitaxial growth or deposition process. In the embodiment illustrated in the present application, a plurality of doped semiconductor material structures 14 are formed from exposed surfaces of each semiconductor fin 12.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming the doped semiconductor material structure 14 may include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE) or metal-organic CVD (MOCVD). The temperature for epitaxial deposition process typically ranges from 250° C. to 900° C. Although higher temperature typically results in faster deposition, the faster deposition may result in crystal defects and film cracking.

A number of different source gases may be used for the deposition of the doped semiconductor material structure 14. In some embodiments, the source gas for the deposition of the doped semiconductor material structures 14 may include a silicon containing gas source or a mixture of a silicon containing gas source and a germanium containing gas source. Carrier gases like hydrogen, nitrogen, helium and argon can be used.

The doped semiconductor material structure 14 includes a semiconductor material and an n-type dopant or a p-type dopant; the dopant may be added during the epitaxial growth process or after utilizing one of gas phase doping or ion implantation. The semiconductor material that provides the doped semiconductor material structure 14 may include one of the semiconductor materials mentioned above for substrate 10. The semiconductor material that provides the doped semiconductor material structure 14 may be the same as, or different from, the semiconductor material that provides either the substrate 10 or the semiconductor fins 12. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The concentration of dopants used in providing the doped semiconductor material structure 14 can range from 5e18 atoms/$cm^3$ to 1.5e21 atoms/$cm^3$.

In some embodiments in which semiconductor fins 12 are formed, the doped semiconductor material structure 14 may contain a plurality of doped semiconductor material subunits that are merged. In yet other embodiments and when semiconductor fins 12 are formed, the doped semiconductor material structure 14 may contain a plurality of doped semiconductor material subunits that are unmerged. Each doped semiconductor material structure 14 may, in some embodiments, have any shape including, for example, diamond shaped or rectangular shaped. The doped semiconductor material structure 14 may, in other embodiments, have an entirely planar topmost surface, or a corrugated surface such as is the case in the embodiment illustrated in FIG. 1.

At this point of the present application, a middle-of-the-line (MOL) dielectric material 16 can be formed. The MOL dielectric material 16 covers the doped semiconductor material structure 14, and the semiconductor fins 12 and has a topmost surface that is typically coplanar with a topmost surface of the gate structure. After MOL dielectric material 16 formation, any sacrificial gate structure may be replaced by a functional gate structure utilizing techniques well known to those skilled in the art. The MOL dielectric material 16 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric material 16. The use of a self-planarizing dielectric material as MOL dielectric material 16 may avoid the need to perform a subsequent planarizing step.

In one embodiment, the MOL dielectric material 16 can be formed utilizing a deposition process including, for example, chemical vapor deposition (CVD), plasma enhanced chemical vapor deposition (PECVD), evaporation or spin-on coating. In some embodiments, a planarization process or an etch back process follows the deposition of the MOL dielectric material 16. The thickness of the MOL dielectric material 16 that can be employed in the present application may vary depending on the type of dielectric material employed as well as the method that was employed in forming the same. In one embodiment, the MOL dielectric material 16 has a thickness from 80 nm to 500 nm. Other thicknesses that are greater or lesser than the range provided above can also be used for the MOL dielectric material 16.

In some embodiments, and as shown, a first dielectric capping layer 18 can be formed on the exposed surface of the MOL dielectric material 16. The first dielectric capping layer 18 may include any suitable dielectric capping material such as, for example, SiC, $Si_3N_4$, $SiO_2$, a carbon doped oxide, a nitrogen and hydrogen doped silicon carbide SiC (N,H) or multilayers thereof; the first dielectric capping layer 18 has a different composition than the underlying MOL dielectric material 16. The first dielectric capping layer 18 can be formed utilizing a conventional deposition process such as, for example, chemical vapor deposition, plasma enhanced chemical vapor deposition, chemical solution deposition, evaporation, or atomic layer deposition. The thickness of the first dielectric capping layer 18 may vary depending on the technique used to form the same as well as the material make-up of the layer. Typically, the first dielectric capping layer 18 has a thickness from 15 nm to 100 nm. Other thicknesses that are lesser than, or greater than the aforementioned thickness range may also be employed as the thickness of the first dielectric capping layer 18.

Next, a contact opening (not shown) is formed into the first dielectric capping layer 18 and the MOL dielectric material 16 in each of the source region and the drain region utilizing conventional techniques such as, for example, lithography and etching. In embodiments in which the first dielectric capping layer 18 is omitted, the contact openings can be formed entirely within the MOL dielectric material 16. At least one of the contact openings exposes a surface of the doped semiconductor material structure 14.

At this point of the preset application, metal semiconductor alloy 20 can be formed on an exposed surface of the doped semiconductor material structure 14 utilizing conventional techniques such as a silicide process that are well known in the art. In some embodiments, the metal semiconductor alloy 20 can be omitted. In one example, the metal semiconductor alloy 20 can be formed by first forming a metal semiconductor alloy forming metal such as, for example, Pt, Ni, Co, Ti, Ta and/or W within each contact opening. An anneal is then performed that is capable of converting the metal semiconductor alloy forming metal and an underlying portion of the doped semiconductor material structure 14 into metal semiconductor alloy 20. The anneal may be performed in a single step or multiple steps with different annealing temperatures may be used. The metal semiconductor alloy 20 may be composed of Ni silicide, Pt silicide, Ti silicide, Ta silicide, W silicide and/or Co silicide. Metal germanides are also possible as the composition of the metal semiconductor alloy 20.

Next, a diffusion barrier liner 22 and a contact metal or metal alloy 24 are formed in the contact openings utilizing techniques well known in the art. In one example, a contiguous layer of a diffusion barrier material is deposited, followed by the deposition of a layer of a contact metal or metal alloy. In some embodiments, the deposition of the layer of contact metal or metal alloy may include a reflow anneal process. A planarization process is then performed to remove the portions of the layer of diffusion barrier material and the layer of contact metal or metal alloy that are present on the topmost surface of the dielectric capping layer 18 and outside the contact openings (not shown). The diffusion barrier liner 22 is composed of a diffusion barrier material including, for example, titanium nitride (TiN), titanium (Ti), tantalum nitride (TaN), tantalum (Ta), tungsten (W), or tungsten nitride (WN). The contact metal or metal alloy 24 may be composed of a low resistivity metal or metal alloy. By "low resistivity metal or metal alloy" it is meant a metal or metal alloy having a resistivity of 10 microOhm-cm or less. Examples of low resistivity metals or metal alloys that can be employed in the present application include, but are not limited to, cobalt (Co), ruthenium (Ru), molybdenum (Mo), osmium (Os), iridium (Ir), rhodium (Rh) and alloys thereof.

In some embodiments, the metal semiconductor alloy 20, the diffusion barrier liner 22 and the contact metal or metal alloy 24 collectively provide a contact structure. In another embodiment, the diffusion barrier liner 22 and the contact metal or metal alloy 24 collectively provide a contact structure.

Next, first interconnect dielectric material 26 is formed atop the contact structure (20, 22, 24) and, if present, the first dielectric capping layer 18. The first interconnect dielectric material 26 may be composed of one of the dielectric materials mentioned above for MOL dielectric material 16. In one embodiment, the first interconnect dielectric material 26 is composed of a same dielectric material as the MOL dielectric material 16. In another embodiment, the first interconnect dielectric material 26 may be composed of a different dielectric material than the MOL dielectric material 16. In one embodiment, the first interconnect dielectric material 26 may be non-porous. In another embodiment, the first interconnect dielectric material 26 may be porous.

The first interconnect dielectric material 26 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0.

The thickness of the first interconnect dielectric material 26 may vary depending upon the type of dielectric material(s) used. In one example, the first interconnect dielectric material 26 may have a thickness from 50 nm to 1000 nm. Other thicknesses that are lesser than, or greater than, the aforementioned thickness range may also be employed in the present application for the thickness of first interconnect dielectric material 26. The first interconnect dielectric material 26 may be formed utilizing an suitable deposition process including, but not limited to, chemical vapor deposition, plasma enhanced chemical vapor deposition or spin-on coating.

Next, contact openings 28A, 28B are formed in the first interconnect dielectric material 26; contact opening 28B extends through the first dielectric capping layer 18 if the same is present within the exemplary semiconductor structure of FIG. 1. As mentioned above, contact opening 28A is a contact opening formed in one of the source region or the drain region, while contact opening 28B is formed in the gate region (not shown). The contact openings 28A, 28B can be formed by lithography and etching.

Figure 2:
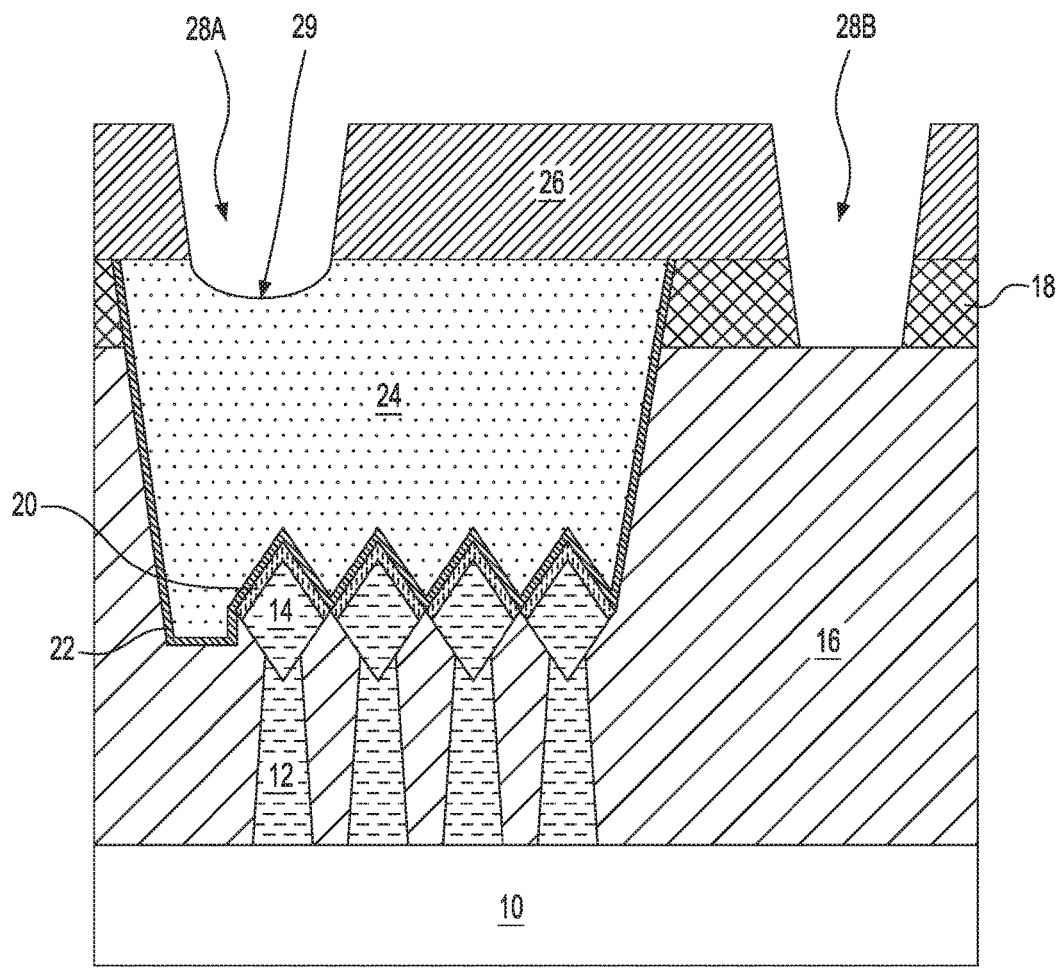
FIG. 2 is a cross sectional view of the exemplary semiconductor structure of FIG. 1 after forming a gouging feature in an upper surface of the contact structure.

Referring now to FIG. 2, there is illustrated the exemplary semiconductor structure of FIG. 1 after forming a gouging feature 29 in an upper surface of the contact structure (i.e., the upper surface of the contact metal or metal alloy 24); no gouging feature is formed into contact opening 28B. The gouging feature 29 (which provides a gouged upper surface) increases the interfacial contact length of the contact metal or metal alloy 24 and thus contact resistance can be improved. The gouging feature 29 may also aide in providing improved mechanical strength and/or anchoring. The gouging feature 29 can provide a concave curvature that extends inward into the contact metal or metal alloy 24. The concave curvature is provided by removing an upper portion of the contact metal or metal alloy 24 of the contact structure.

The gouging feature 29 may be formed by any gouging process that is capable of providing a gouged surface (i.e., a surface having a concave curvature) to a material. Examples of gouging processes that may be used in providing the gouging feature 29 include argon plasma sputtering, reactive ion etching, or a wet etch.

Figure 3:
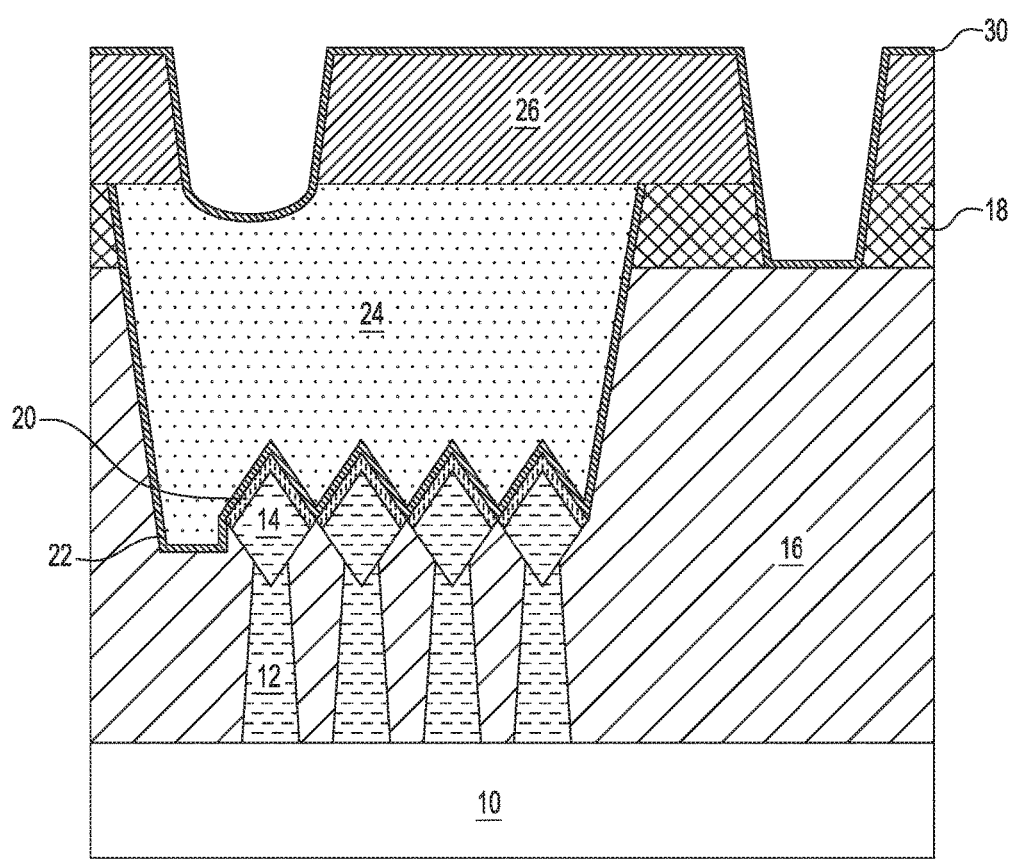
FIG. 3 is a cross sectional view of the exemplary semiconductor structure of FIG. 2 after forming a continuous layer of a diffusion barrier material on a topmost surface of the first interconnect dielectric material and within each contact opening.

Referring now to FIG. 3, there is illustrated the exemplary semiconductor structure of FIG. 2 after forming a continuous layer of a diffusion barrier material 30 on a topmost surface of the first interconnect dielectric material 26 and within each contact opening 28A, 28B. The continuous layer of diffusion barrier material 30 includes one of the diffusion barrier materials mentioned above for the diffusion barrier liner 22. The continuous layer of diffusion barrier material 30 may be formed utilizing any suitable deposition process such as, for example, chemical vapor deposition. The continuous layer of diffusion barrier material 30 is of a thickness that does not fill the entirely of each of the contact opening 28A, 28B.

Figure 4:
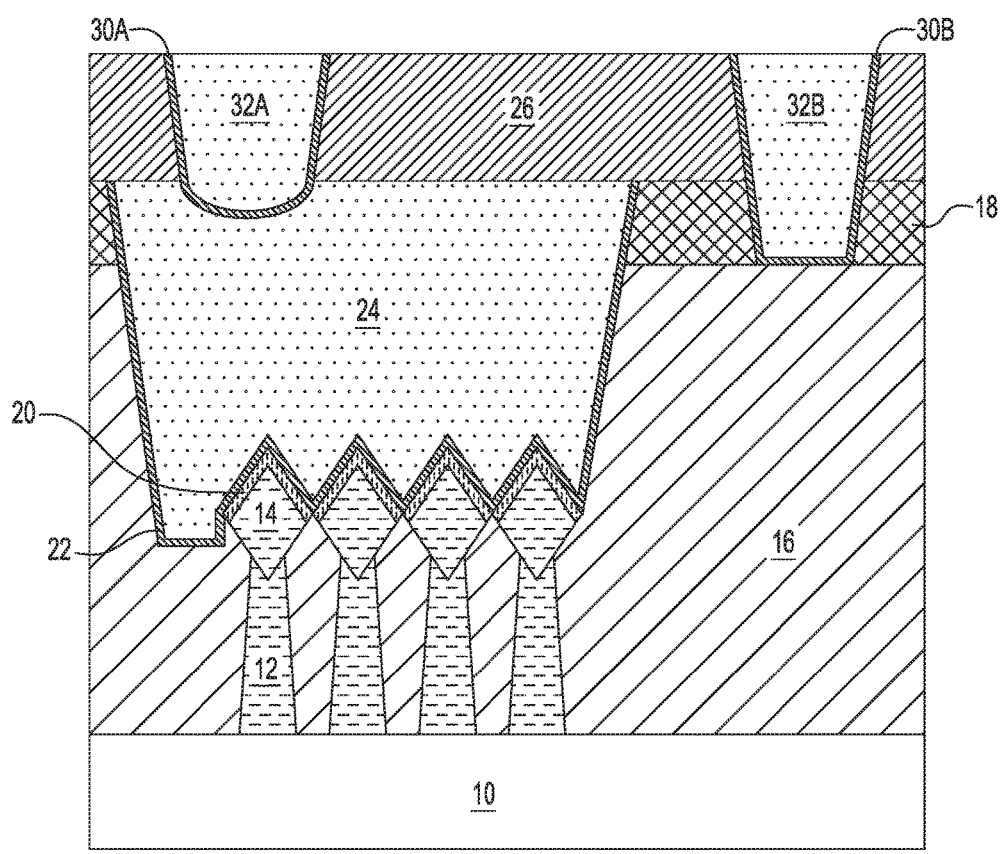
FIG. 4 is a cross sectional view of the exemplary semiconductor structure of FIG. 3 after forming a first metallization structure in each contact opening within the first interconnect dielectric material.

Referring now to FIG. 4, there is illustrated the exemplary semiconductor structure of FIG. 3 after forming a first metallization structure 32A, 32B in each contact opening within the first interconnect dielectric material 26. Each first metallization structure 32A, 32B comprises one of the low resistivity metals or metal alloys mentioned above for the contact metal or metal alloy 24. In one embodiment, each first metallization structure 32A, 32B comprises a same low resistivity metal or metal alloy as the contact metal or metal alloy 24. In another embodiment, each first metallization structure 32A, 32B comprises a different low resistivity metal or metal alloy than the contact metal or metal alloy 24. Each first metallization structure 32A, 32B can be formed by deposition of a low resistivity metal or metal alloy followed by a planarization process to provide the planar structure illustrated in FIG. 4. In some embodiments, a reflow anneal process can be used to provide each first metallization structure 32A, 32B. Planarization may include chemical mechanical polishing (CMP) and/or grinding.

As is shown, a portion of the continuous layer of diffusion barrier material 30 remains in each of the contact openings 28A, 28B after performing the planarization process. Each remaining portion of the continuous layer of diffusion barrier material 30 may be referred to herein as a diffusion barrier liner 30A, 30B. As is shown, a bottommost surface of the first metallization structure 32A and the bottommost surface of diffusion barrier liner 30A present in contact opening 28A are rounded. As is further shown, the bottommost portion of the first metallization structure 32A is located beneath a topmost surface of the contact metal or metal alloy 24. Each first metallization structure 32A, 32B has a topmost surface that is coplanar with first interconnect dielectric material 26.

Figure 5:
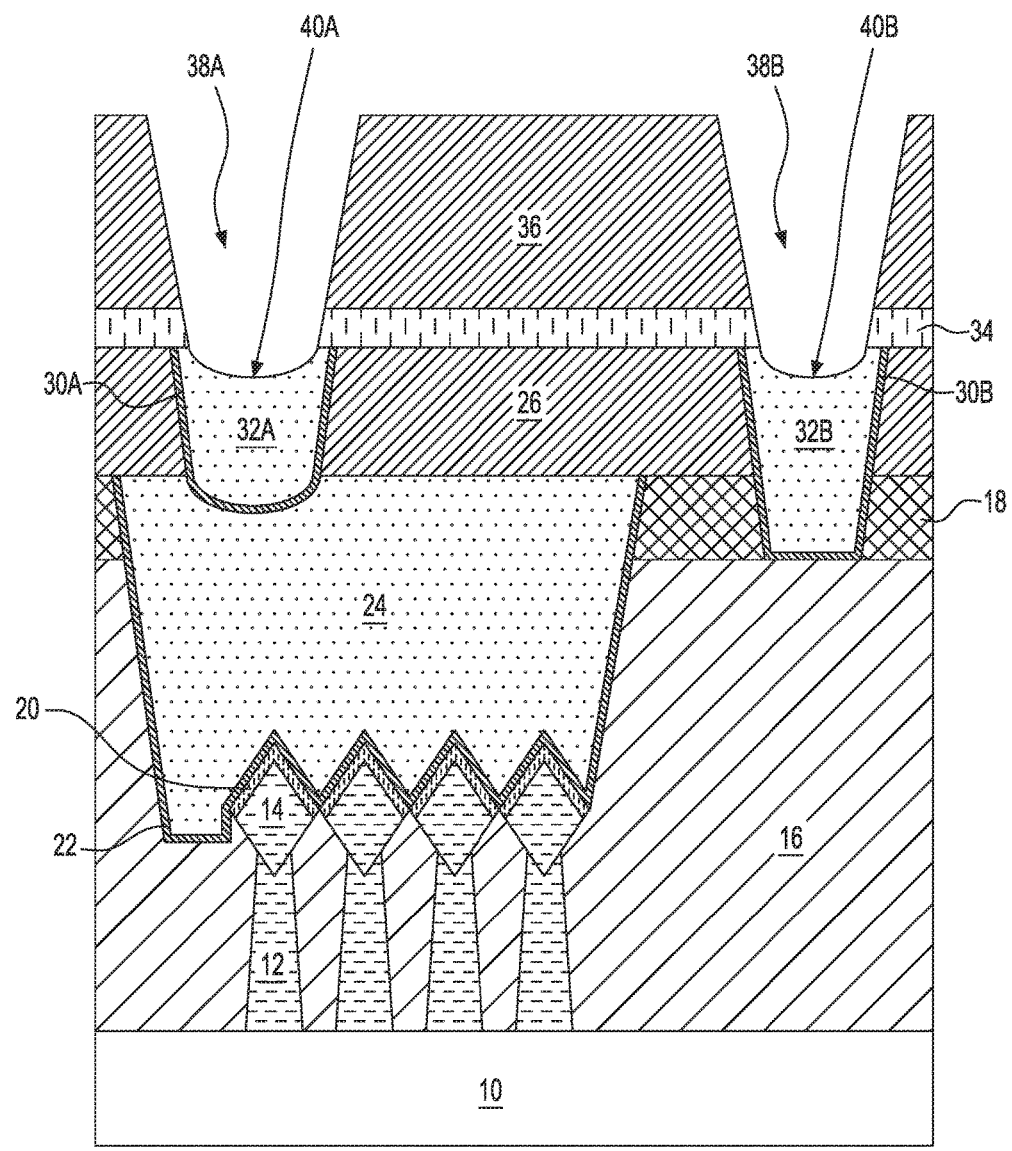
FIG. 5 is a cross sectional view of the exemplary semiconductor structure of FIG. 4 after forming at least a second interconnect dielectric material containing contact openings above the first interconnect dielectric material, and forming a gouging feature in an upper surface of each first metallization structure.

Referring now to FIG. 5, there is illustrated the exemplary semiconductor structure of FIG. 4 after forming at least a second interconnect dielectric material 36 containing contact openings 38A, 38B above the first interconnect dielectric material 24, and forming a gouging feature 40A, 40B in an upper surface of each first metallization structure 32A, 32B. In some embodiments, a second dielectric capping layer 34 can be formed between the first and second interconnect dielectric materials 26 and 36.

When present, the second dielectric capping layer 34 includes one of the dielectric capping materials mentioned above for the first dielectric capping layer 18; the second dielectric capping material has a different composition than the first and second interconnect dielectric materials (26, 36). In some embodiments, the second dielectric capping layer 34 comprises a same dielectric capping material as the first dielectric capping layer 18. In other embodiments, the second dielectric capping layer 34 comprises a different dielectric capping material than the first dielectric capping layer 18. The second dielectric capping layer 34 can be formed utilizing one of the deposition processes mentioned above in forming the first dielectric capping layer 18. The second dielectric capping layer 34 may have a thickness within the thickness range mentioned above for the first dielectric capping layer 18.

The second interconnect dielectric material 36 can include one of the dielectric materials mentioned above for the first interconnect dielectric material 26. In some embodiments, the second interconnect dielectric material 36 comprises a same dielectric material as the first interconnect dielectric material 26. In other embodiments, the second interconnect dielectric material 36 comprises a different dielectric material than the first interconnect dielectric material 26. The second interconnect dielectric material 36 can be formed utilizing one of the deposition processes mentioned above in forming the first interconnect dielectric material 26. The second interconnect dielectric material 36 may have a thickness within the thickness range mentioned above for the first interconnect dielectric material 26.

Contact openings 38A, 38B can be formed by lithography and etching. Contact openings 38A, 38B extend entirely through the second interconnect dielectric material 36, and if present, entirely through the second dielectric capping layer 34. Each gouging feature 40A, 40B can be formed utilizing one of the gouging processes mentioned above for forming gouging feature 29. The gouging process provides a concave curvature to an upper surface of each first metallization structure 32A, 32B.

Figure 6:
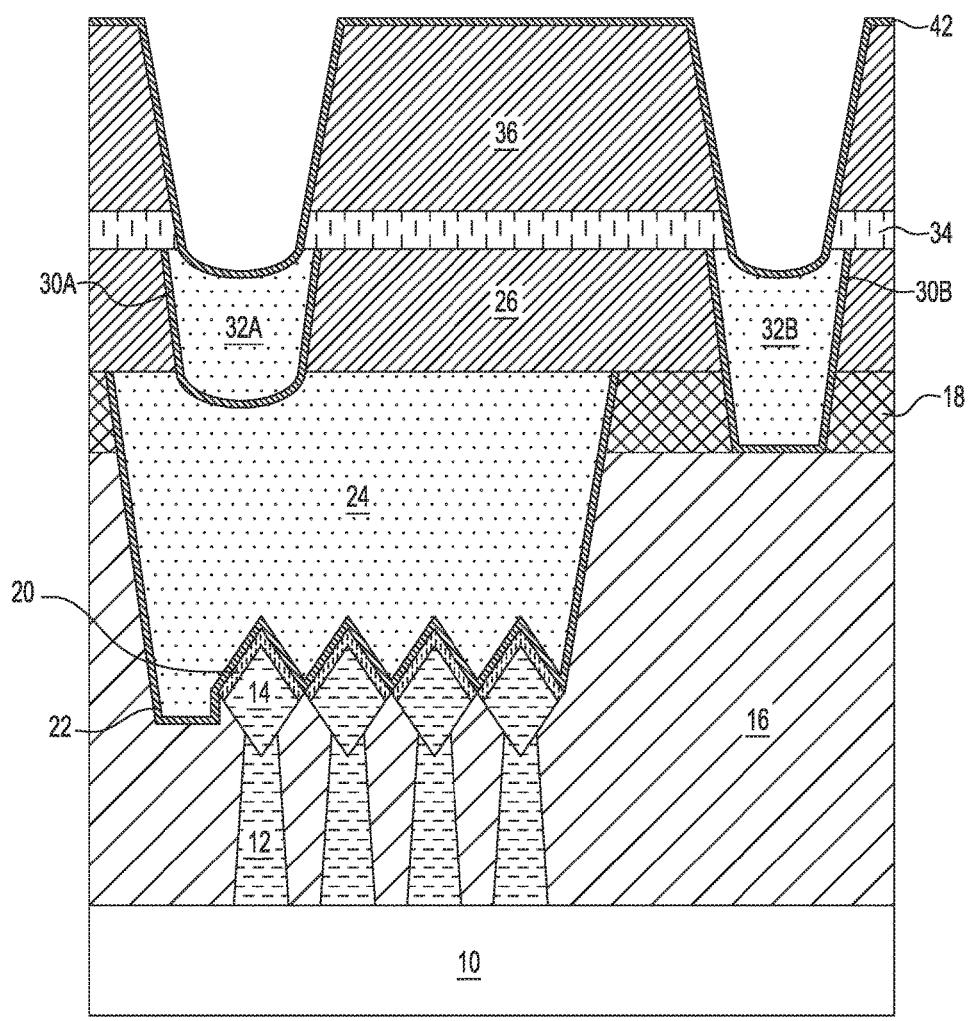
FIG. 6 is a cross sectional view of the exemplary semiconductor structure of FIG. 5 after forming another continuous layer of a diffusion barrier material on a topmost surface of the second interconnect dielectric material and within each contact opening.

Referring now to FIG. 6, there is illustrated the exemplary semiconductor structure of FIG. 5 after forming another continuous layer of a diffusion barrier material 42 on a topmost surface of the second interconnect dielectric material 36 and within each contact opening 38A, 38B. The continuous layer of diffusion barrier material 42 includes one of the diffusion barrier materials mentioned above for the diffusion barrier liner 22. The continuous layer of diffusion barrier material 42 may be formed utilizing any suitable deposition process such as, for example, chemical vapor deposition. The continuous layer of diffusion barrier material 42 is of a thickness that does not fill the entirely of each of the contact opening 38A, 38B.

Figure 7:
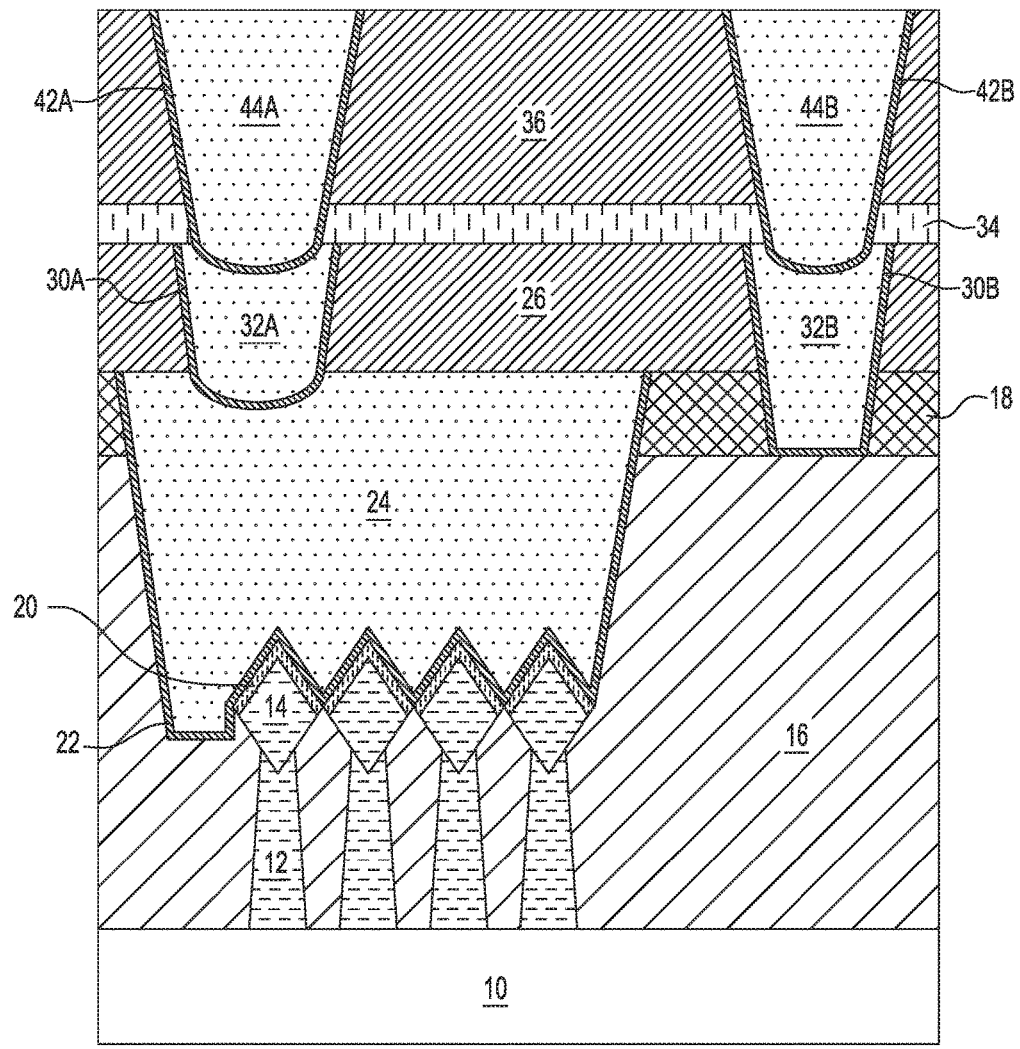
FIG. 7 is a cross sectional view of the exemplary semiconductor structure of FIG. 6 after forming a second metallization structure in each contact opening within the second interconnect dielectric material.

Referring now to FIG. 7, there is illustrated the exemplary semiconductor structure of FIG. 6 after forming a second metallization structure 44A, 44B in each contact opening 38A, 38B within the second interconnect dielectric material 36. Each second metallization structure 44A, 44B has a topmost surface that is coplanar with a topmost surface of the second interconnect dielectric material 36.

Each second metallization structure 44A, 44B comprises one of the low resistivity metals or metal alloys mentioned above for the contact metal or metal alloy 24. In one embodiment, each second metallization structure 44A, 44B comprises a same low resistivity metal or metal alloy as the contact metal or metal alloy 24. In another embodiment, each second metallization structure 44A, 44B comprises a different low resistivity metal or metal alloy than the contact metal or metal alloy 24. Each second metallization structure 44A, 44B may include a same or different low resistivity metal or metal alloy as that which provides each first metallization structure 32A, 32B. Each second metallization structure 44A, 44B can be formed by deposition of a low resistivity metal or metal alloy followed by a planarization process to provide the planar structure illustrated in FIG. 7. A reflow anneal process may also be used in providing the each second metallization structure 44A, 44B. Planarization may include chemical mechanical polishing (CMP) and/or grinding.

As is shown, a portion of the continuous layer of diffusion barrier material 42 remains in each of the contact openings 38A, 38B after performing the planarization process. Each remaining portion of the continuous layer of diffusion barrier material 42 may be referred to herein as a diffusion barrier liner 42A, 42B. As is shown, a bottommost surface of each second metallization structure 44A, 44B and the bottommost surface of each diffusion barrier liner 42A, 442B present in contact openings 38A, 38B are rounded. As is further shown, the bottommost portion of the second metallization structure 44A, 44B is located beneath a topmost surface of the first metallization structure 32A, 32B.

Other interconnect levels can be formed atop the exemplary semiconductor structure shown in FIG. 7 utilizing the processing steps mentioned in FIGS. 5-7. Each successive interconnect level includes at least an interconnect dielectric material containing a gouged metallization structure as described above. The presence of the gouged metallization structures provides an multi-level interconnect structure that has increased mechanical strength, improved anchoring and/or lower contact resistance.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    providing a contact structure containing a gouged upper surface embedded in at least a middle-of-the-line (MOL) dielectric material and contacting a doped semiconductor material structure, wherein a first interconnect dielectric material containing a first contact opening is present above said contact structure and said MOL dielectric material, and wherein said first contact opening exposes said gouged upper surface of said contact structure;
    forming a first metallization structure in said first contact opening;
    forming at least a second interconnect dielectric material containing a second contact opening above said first interconnect dielectric material, wherein said second contact opening exposes said first metallization structure;
    forming a gouging feature in an upper surface of said first metallization structure; and
    forming a second metallization structure in said second contact opening.

2. The method of claim 1, wherein each of said contact structure, said first metallization structure, and said second metallization structure comprises a metal or metal alloy having a resistivity of 10 microOhm-cm or less.

3. The method of claim 2, wherein said metal or metal alloy having said resistivity of 10 microOhm-cm or less is selected from the group consisting of cobalt (Co), ruthenium (Ru), molybdenum (Mo), osmium (Os), iridium (Jr) and rhodium (Rh).

4. The method of claim 1, wherein said gouged upper surface of said contact structure is formed by argon plasma sputtering, reactive ion etching or a wet etch.

5. The method of claim 1, wherein said forming said gouging feature comprising argon plasma sputtering, reactive ion etching or a wet etch.

6. The method of claim 1, wherein said doped semiconductor material structure comprises a plurality of diamond shaped doped semiconductor material subunits that are merged.

7. The method of claim 1, wherein said doped semiconductor material structure is present on a portion of at least one semiconductor fin.

8. The method of claim 1, wherein said forming said first metallization structure comprises:
    depositing a continuous layer of a diffusion barrier material;
    forming a metal or metal alloy having a resistivity of 10 microOhm-cm or less on said continuous layer of diffusion barrier material; and
    removing said metal or metal alloy having said resistivity of 10 microOhm-cm or less and said continuous diffusion barrier material that is present outside the first contact opening.

9. The method of claim 1, wherein said forming said second metallization structure comprises:
    depositing a continuous layer of a diffusion barrier material;
    forming a metal or metal alloy having a resistivity of 10 microOhm-cm or less on said continuous layer of diffusion barrier material; and
    removing said metal or metal alloy having said resistivity of 10 microOhm-cm or less and said continuous diffusion barrier material that is present outside the second contact opening.

10. The method of claim 1, wherein said first metallization structure has a rounded bottommost surface that extends beneath a topmost surface of said contact structure, and wherein said second metallization structure has a rounded bottommost surface that extends beneath a topmost surface of said first metallization structure.

11. The method of claim 1, wherein said contact structure comprises a metal semiconductor alloy in direct physical contact with a surface of said doped semiconductor structure, a diffusion barrier liner located on said metal semiconductor alloy and contacting portions of said at least one MOL dielectric material, and a metal or metal alloy having a resistivity of 10 microOhm-cm or less located on said diffusion barrier liner, wherein said diffusion barrier liner has a topmost surface that is coplanar with a topmost surface of said metal or metal alloy having said resistivity of 10 microOhm-cm or less.

12. The method of claim 1, wherein said contact structure comprises a diffusion barrier liner located on a surface of said doped semiconductor structure and contacting portions of said at least one MOL dielectric material, and a metal or metal alloy having a resistivity of 10 microOhm-cm or less located on said diffusion barrier liner, wherein said diffusion barrier liner has a topmost surface that is coplanar with a topmost surface of said metal or metal alloy having said resistivity of 10 microOhm-cm or less.

13. The method of claim 1, wherein gouged upper surface of said contact structure has a concave shape, and wherein said gouged feature has a concave shape.

14. The method of claim 1, wherein a dielectric capping layer is located between the at least one MOL dielectric material and said first interconnect dielectric material, and wherein an upper portion of said contact structure is embedded in the dielectric capping layer.

15. The method of claim 1, wherein said first metallization structure comprises a diffusion barrier liner and a metal or metal alloy having a resistivity of 10 microOhm-cm or less.

16. The method of claim 15, wherein the diffusion barrier liner has a topmost surface that is coplanar with a topmost surface of said metal or metal alloy having said resistivity of 10 microOhm-cm or less and with a topmost surface of said first interconnect dielectric material.

17. The method of claim 1, wherein said second metallization structure comprises a diffusion barrier liner and a metal or metal alloy having a resistivity of 10 microOhm-cm or less.

18. The method of claim 17, wherein the diffusion barrier liner has a topmost surface that is coplanar with a topmost surface of said metal or metal alloy having said resistivity of 10 microOhm-cm or less and with a topmost surface of said first interconnect dielectric material.

19. The method of claim 1, further comprising forming a dielectric capping layer on first interconnect dielectric material and said first metallization structure prior to forming the second interconnect dielectric material.

\* \* \* \* \*